(12) United States Patent
Lin

(10) Patent No.: US 9,465,475 B2
(45) Date of Patent: Oct. 11, 2016

(54) TOUCH PANEL AND METHOD OF FORMING THE SAME

(71) Applicant: Chung Hua University, Hsinchu (TW)

(72) Inventor: Jium Ming Lin, Hsinchu (TW)

(73) Assignee: Chung Hua University, Hsinchu (TW)

( * ) Notice: Subject to any disclaimer, the term of this patent is extended or adjusted under 35 U.S.C. 154(b) by 250 days.

(21) Appl. No.: 14/175,272

(22) Filed: Feb. 7, 2014

(65) Prior Publication Data

US 2014/0247231 A1 Sep. 4, 2014

(30) Foreign Application Priority Data

Mar. 1, 2013 (TW) .............................. 102107187 A

(51) Int. Cl.
*G06F 3/041* (2006.01)
*G01L 1/16* (2006.01)
*H01L 41/113* (2006.01)

(52) U.S. Cl.
CPC ............... *G06F 3/0414* (2013.01); *G01L 1/16* (2013.01); *H01L 41/1132* (2013.01)

(58) Field of Classification Search
CPC ..... G06F 3/0414; H01L 41/1132; G01L 1/16
USPC ............................ 345/173; 178/18.01–20.04
See application file for complete search history.

(56) References Cited

U.S. PATENT DOCUMENTS 4,429,413 A * 1/1984 Edwards ............... A61B 5/1172
257/E27.006
4,644,100 A 2/1987 Brenner et al.
9,030,289 B2 * 5/2015 Lai ........................... G06F 3/045
338/47

(Continued)

FOREIGN PATENT DOCUMENTS

CN 1510768 A 7/2004
TW 201117071 5/2011

(Continued)

OTHER PUBLICATIONS

Office Action and Search Report dated Mar. 18, 2015 from the Taiwan counterpart application 102107187.

(Continued)

*Primary Examiner* — Kumar Patel
*Assistant Examiner* — Vinh Lam
(74) *Attorney, Agent, or Firm* — WPAT, P.C., Intellectual Property Attorneys; Anthony King

(57) ABSTRACT

A touch panel comprises a plurality of basic sensing-units arranged in a matrix. The basic sensing-unit comprises a pressure-sensing transistor and a selection transistor. The pressure-sensing transistor comprises a first terminal, a second terminal, a gate electrode, a mask layer, a channel connecting the first and second terminals, a dielectric layer formed on the channel, and a piezoelectric material deposited on the dielectric layer. The piezoelectric material may comprise PVDF, lead zirconate titanate, ZnO, $BaTiO_3$, $LiNbO_3$, or $PbTiO_3$. The selection transistor comprises a first terminal, a second terminal, and a third terminal. The first terminal of the selection transistor connects to a sensing electrode of the touch panel, the second terminal of the selection transistor connects to the first terminal of the pressure sensing transistor, and the third terminal of the selection transistor is a transistor gate and connects to a drive electrode of the touch panel.

11 Claims, 7 Drawing Sheets

(56) References Cited

U.S. PATENT DOCUMENTS

| | | | |
|---|---|---|---|
| 9,046,974 B2* | 6/2015 | Cok | G06F 3/044 |
| 9,141,224 B1* | 9/2015 | Rowe | G06F 3/0414 |
| 9,184,502 B2* | 11/2015 | Yang | H01Q 1/2266 |
| 2004/0119903 A1* | 6/2004 | Chang | G02F 1/133516 |
| | | | 349/43 |
| 2004/0120183 A1 | 6/2004 | Appenzeller et al. | |
| 2005/0065280 A1 | 3/2005 | Subramaniam et al. | |
| 2009/0326337 A1* | 12/2009 | Solin | G01N 15/1031 |
| | | | 600/300 |
| 2010/0123671 A1* | 5/2010 | Lee | G01L 1/16 |
| | | | 345/173 |
| 2010/0141599 A1* | 6/2010 | Wang | G06F 3/044 |
| | | | 345/173 |
| 2010/0201651 A1* | 8/2010 | Baucom | G09F 9/372 |
| | | | 345/174 |
| 2010/0265187 A1* | 10/2010 | Chang | G06F 3/044 |
| | | | 345/173 |
| 2010/0288048 A1* | 11/2010 | Harris | G01L 9/0098 |
| | | | 73/584 |
| 2011/0000060 A1* | 1/2011 | Lee | H01L 27/20 |
| | | | 29/25.35 |
| 2011/0049579 A1* | 3/2011 | Dumitru | B82Y 10/00 |
| | | | 257/254 |
| 2011/0108936 A1* | 5/2011 | Meng | G01L 1/005 |
| | | | 257/419 |
| 2011/0227836 A1* | 9/2011 | Li | G06F 3/0414 |
| | | | 345/173 |
| 2011/0239790 A1* | 10/2011 | Kuczynski | G01L 1/16 |
| | | | 73/862.624 |
| 2011/0273651 A1* | 11/2011 | Kim | H01L 27/12 |
| | | | 349/110 |
| 2012/0256838 A1* | 10/2012 | Lee | H03K 17/9643 |
| | | | 345/168 |
| 2013/0027326 A1* | 1/2013 | Kim | G06F 3/042 |
| | | | 345/173 |
| 2013/0155017 A1* | 6/2013 | Rehn | G06F 3/0414 |
| | | | 345/174 |
| 2013/0162570 A1* | 6/2013 | Shin | G06F 3/041 |
| | | | 345/173 |
| 2014/0217853 A1* | 8/2014 | Mankowski | H02N 2/18 |
| | | | 310/319 |
| 2014/0218334 A1* | 8/2014 | Shibata | G06F 3/044 |
| | | | 345/174 |
| 2015/0138276 A1* | 5/2015 | Abbott, Jr. | B41J 2/1618 |
| | | | 347/40 |

FOREIGN PATENT DOCUMENTS

| | | |
|---|---|---|
| TW | 201142683 | 12/2011 |
| TW | 201209667 | 3/2012 |

OTHER PUBLICATIONS

English translation of Office Action and Search Report dated Mar. 18, 2015 from the Taiwan counterpart application 102107187, TW201117071, TW201142683 and TW201209667.
Office Action dated Jul. 14, 2016 from the China counterpart application 201310142891.X.
Search report dated Jul. 14, 2016 from the China counterpart application 201310142891.X.
English abstract translation of the Office Action dated Jul. 14, 2016 from the China counterpart application 201310142891.X.
US20040120183 corresponds to CN1510768A.

* cited by examiner

TOUCH PANEL AND METHOD OF FORMING THE SAME

BACKGROUND OF THE INVENTION

1. Field of the Invention

The present invention relates to a touch panel and a method of forming the same.

2. Description of the Related Art

Due to the popularity of computers, keyboards and optical mice, such devices have become some of the most commonly used data input apparatuses. However, because they are bulky and inconvenient to carry, a touch input device that can be combined with a screen is additionally being developed.

A touch panel can be operated either directly by a finger or by a stylus. A touch panel is a humanized input device that allows contact on a specific area on a panel to input a command The trend of developing light, thin, short and small electronic products with complex functions has resulted in such electronic products having reduced space for housing additional parts; therefore, having a touch panel that occupies less space is suitable. In addition to simultaneously providing the functions of a keyboard and an optical mouse, a touch panel allows handwriting. Therefore, the touch panel is a best choice as a human-machine interface.

According to their operating principles, touch panels can be categorized into resistive, capacitive, optical, and surface acoustic wave types. A resistive type panel has a disadvantage of having low light transmittance; therefore, its brightness and contrast are low. A capacitive panel is easily affected by panel temperature and humidity, and its detection result varies with the ground voltage level; therefore, the capacitive panel has poorer stability. In addition, a capacitive panel cannot have a detection result if a nonconductor is used to operate. The resolution of an optical touch panel is determined by the number of infrared emitters and corresponding receivers applied on the optical touch panel; therefore, the resolution of an optical touch panel is restricted. A surface acoustic wave panel uses a transmit transducer to emit a surface wave and a receive transducer to receive the surface wave, and the surface acoustic wave panel determines a touch location according to the relationship between signal strength and time. U.S. Pat. No. 4,644,100 discloses a surface acoustic wave touch device employing a single transmitting transducer and a single receiving transducer. Since sound waves are quite fast, a high speed signal processor and high performance analog/digital converter is required and results in high cost. However, lowering the cost will compromise the resolution.

The present touch panels still have several disadvantages and require further improvements.

SUMMARY OF THE INVENTION

In one embodiment of the present invention, a touch panel comprises a substrate, a plurality of transparent drive electrodes arranged in a matrix and formed on the substrate, a plurality of transparent sensing electrodes arranged in a matrix and formed on the substrate, and a plurality of basic sensing-units arranged in a matrix and formed on the substrate. Each sensing-unit comprises a pressure-sensing transistor and a selection transistor. The pressure-sensing transistor comprises a first terminal, a second terminal, a channel connecting the first and second terminals, a dielectric layer formed on the channel, and a piezoelectric material formed on the dielectric layer. The piezoelectric material comprises PVDF (polyvinylidene fluoride or polyvinylidene difluoride), or a mixture of PVDF and any one of lead zirconate titanate, zinc oxide, barium titanate, lithium niobate, or lead titanate. The selection transistor is formed on the substrate. The selection transistor comprises a first terminal, a second terminal, and a third terminal. The first terminal of the selection transistor connects to a corresponding one of the sensing electrodes, the second terminal of the selection transistor connects to the first terminal of the pressure-sensing transistor, and the third terminal of the selection transistor is a transistor gate and connects to a corresponding one of the drive electrodes.

In one embodiment of the present invention, a method of forming a touch panel comprises forming a first conductor layer on a substrate; forming a semiconductor layer, corresponding to the first conductor layer, on the substrate, wherein the semiconductor layer comprises a channel; forming a first terminal and second terminal on the substrate, wherein the first terminal and second terminal connect to the channel; forming a piezoelectric material corresponding to the first conductor layer; forming a second conductor layer corresponding to the first conductor layer; and applying a voltage between the first conductor layer and the second conductor layer to generate a polarization of the piezoelectric material.

BRIEF DESCRIPTION OF THE DRAWINGS

The objectives and advantages of the present invention will become apparent upon reading the following description and upon referring to the accompanying drawings in which.

DETAILED DESCRIPTION OF THE INVENTION

Figure 1:
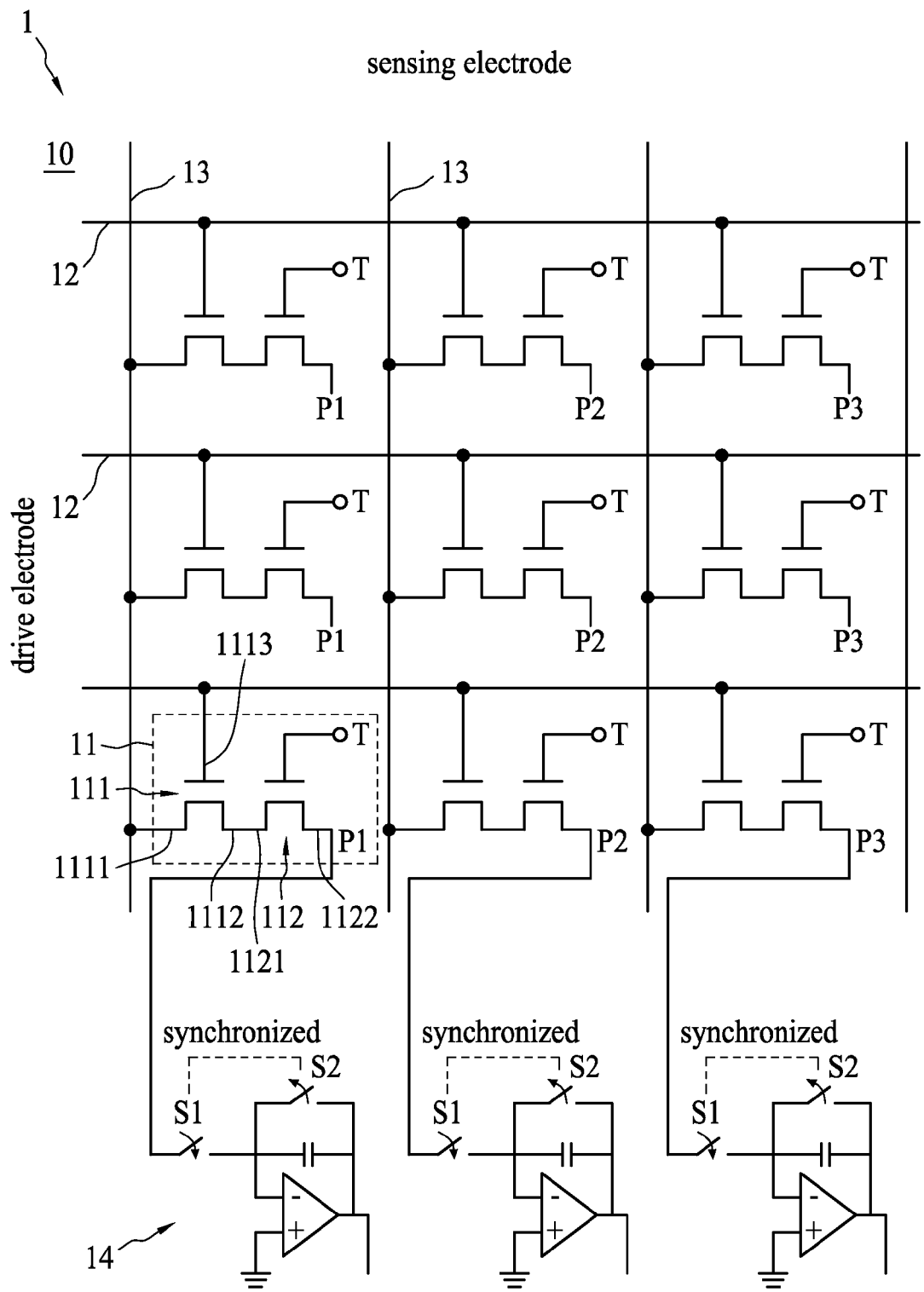
FIG. 1 schematically shows a touch panel according to one embodiment of the present invention.

FIG. 1 schematically shows a touch panel 1 according to one embodiment of the present invention. Referring to FIG. 1, the touch panel 1 comprises a plurality of basic sensing-units 11 arrayed in a matrix. The plurality of basic sensing-units 11 can be arranged, but is not limited to being, on a substrate 10. A plurality of drive electrodes 12 and a plurality of sensing electrodes 13 are formed on the substrate 10 and separate the sensing-units 11. Each sensing-unit 11 connects to an adjacent drive electrode 12 and an adjacent sensing electrode 13. The sensing unit 11 is configured to sense a touch position, or a single touch region or multi-touch positions (or regions). The drive electrode 12 and the sensing electrode 13 can be made of a transparent conductor, such as indium tin oxide, so that the substrate 10 is transparent. A scanning voltage can be applied to the electrodes of each of two sets of drive electrodes 12 and sensing electrodes 13 one after another so as to retrieve a signal stored in each sensing unit 11. Accordingly, a touch position, a single touch region, or multi-touch regions (or positions) can be determined.

In one embodiment, the substrate 10 is made of a non-semiconductor material.

Referring to FIG. 1, each sensing-unit 11 comprises a selection transistor 111 and a pressure-sensing transistor 112. The selection transistor 111 and the pressure-sensing transistor 112 can be formed on the substrate 10 and can be connected in series.

Preferably, the selection transistor 111 comprises a first terminal (or a source) 1111, a second terminal (or a drain) 1112, and a third terminal (or a gate) 1113. The pressure-sensing transistor 112 comprises a first terminal (a source) 1121, a second terminal 1122 (or an end (P1, P2, or P3), as shown in FIG. 1; a drain), and a T end (FIG. 1), which is a terminal for polarizing a piezoelectric material. The first terminal 1111 of the selection transistor 111 connects to an adjacent sensing electrode 13. The second terminal 1112 connects to the first terminal 1121 of the pressure-sensing transistor 112. The third terminal 1113 can be a gate terminal and can connect to an adjacent drive electrode 12. When a scanning voltage is applied to a drive electrode 12, corresponding selection transistors 111 are activated, and each activated selection transistor 111 allows charges to flow into a corresponding pressure-sensing transistor 112 when a voltage is applied to a corresponding sensing electrode 13. When pulse voltages are periodically applied to the drive electrodes 12 and the sensing electrodes 13, the pressure-sensing transistors 112 can be scanned to detect if there is any current flowing through each pressure-sensing transistor 112. Accordingly, a touch position, a single touch region, or multi-touch regions (or positions) can be detected.

In one embodiment, the selection transistor 111 comprises a p-type metal oxide semiconductor transistor. In one embodiment, the selection transistor 111 comprises an n-type metal oxide semiconductor transistor. In one embodiment, the pressure-sensing transistor 112 comprises a p-type metal oxide semiconductor transistor. In one embodiment, the pressure-sensing transistor 112 comprises an n-type metal oxide semiconductor transistor.

Figure 2:
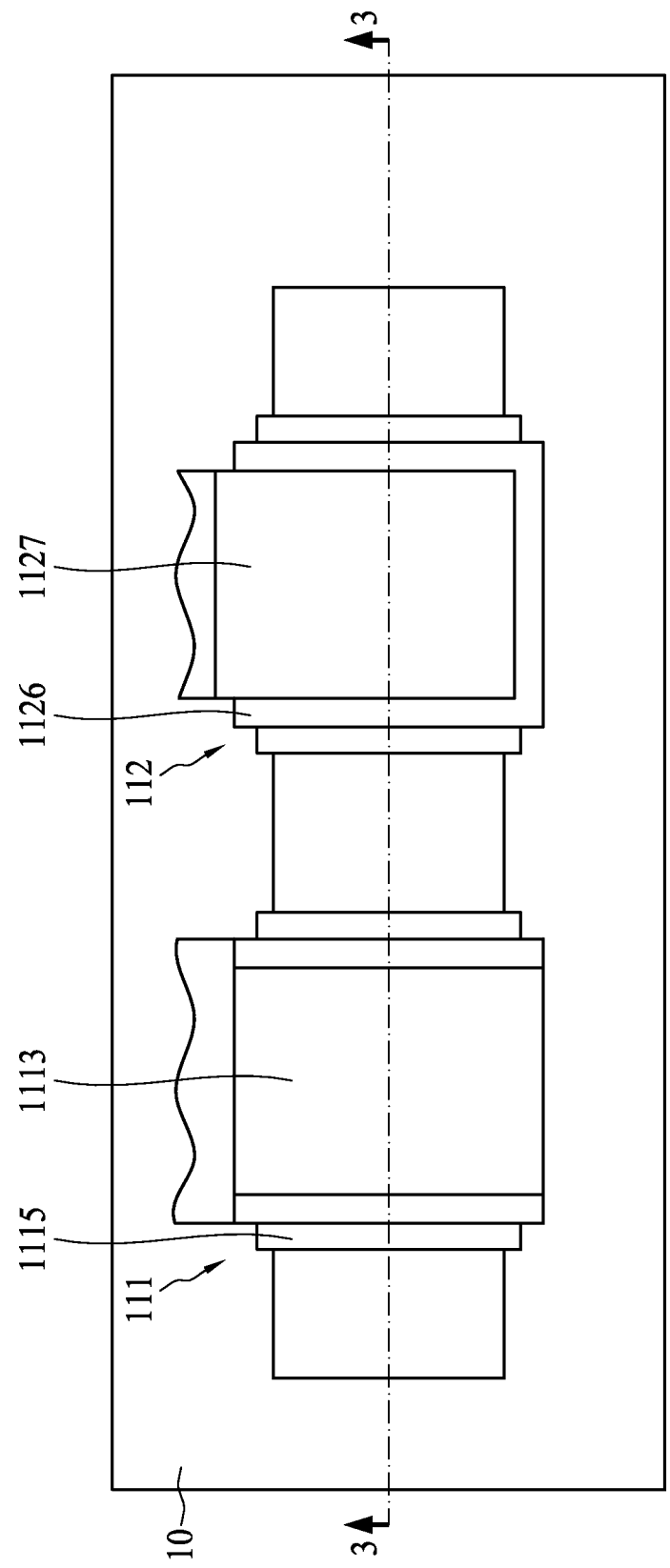
FIG. 2 schematically shows a selection transistor and a pressure-sensing transistor, which are connected in series.
Figure 3:
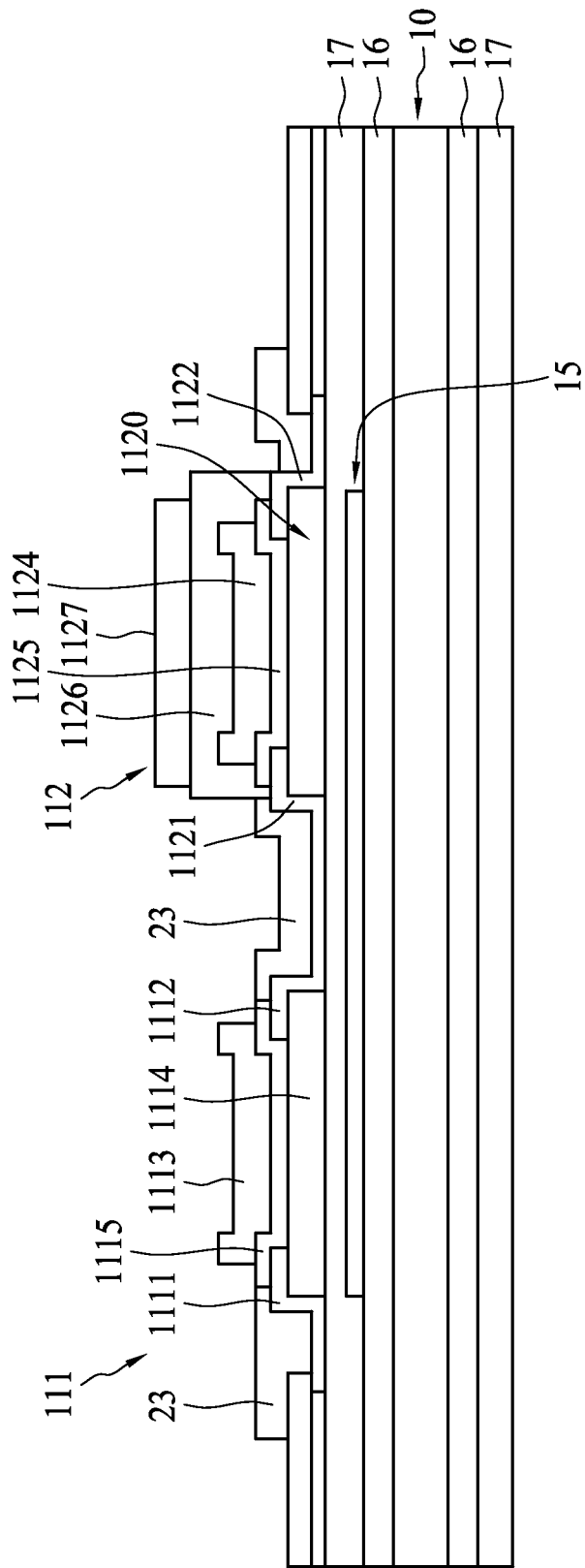
FIG. 3 is a cross-sectional view along line 3-3 of FIG. 2.

Referring to FIGS. 2 and 3, the pressure-sensing transistor 112 comprises a channel 1120, which connects to the first terminal 1121 and the second terminal 1122. The pressure-sensing transistor 112 can further comprise a piezoelectric material 1124 and an insulation layer 1125. The insulation layer 1125 is formed on the channel 1120 and the piezoelectric material 1124 is formed on the insulation layer 1125.

A plurality of black matrix materials 15 can be formed on the substrate 10. The black matrix material 15 can be a conductive layer. The black matrix material 15 can be a light blocking metal layer. In one embodiment, each black matrix material 15 is disposed below a corresponding pressure-sensing transistor 112. In one embodiment, each black matrix material 15 is disposed under a corresponding pressure-sensing transistor 112 and a corresponding selection transistor 111 so as to prevent light interference on the transistors. In one embodiment, the black matrix material 15 comprises chrome or nickel-chrome alloy. In one embodiment, the black matrix material 15 can shield electromagnetic waves. In one embodiment, the black matrix material 15 can be grounded and used with the T ends to polarize the piezoelectric materials.

In one embodiment, the pressure-sensing transistor 112 comprises an n-type metal oxide semiconductor transistor. The method of polarizing the piezoelectric material 1124 is described as follows: a suitable negative voltage is applied between the gate (i.e., T end) 1127 of the pressure-sensing transistor 112 and the corresponding black matrix material 15 so as to pole the piezoelectric material 1124 in an upward direction. In other words, positive charges are collected above the insulation layer 1125 and attract a small amount of negative charges to an upper surface of the channel 1120 of the pressure-sensing transistor 112, which causes the pressure-sensing transistor 112 to be close to a threshold of current conduction and have a current of less than 1 microampere (may not limited) flowing through. Consequently, when the pressure-sensing transistor 112 is touched, the strength of the upward polarization increases and more negative charges reside near the upper surface of the channel 1120. As a result, the pressure-sensing transistor 112 is closed and allows larger currents of more than 10 microamperes (may not limited) to flow through the channel 1120.

In another embodiment, the pressure-sensing transistor 112 comprises a p-type metal oxide semiconductor transistor. The method of polarizing the piezoelectric material 1124 is described as follows: a suitable positive voltage is applied between the gate 1127 of the pressure-sensing transistor 112 and the corresponding black matrix material 15 so as to pole the piezoelectric material 1124 in a downward direction. In other words, negative charges are collected above the insulation layer 1125 and attract a small amount of positive charges to an upper surface of the channel 1120 of the pressure-sensing transistor 112, which causes the pressure-sensing transistor 112 to be close to a threshold of current conduction and have a current of less than 1 microampere (may not limited to) flowing through. Consequently, when the pressure-sensing transistor 112 is touched, the strength of the polarization increases and more positive charges reside near the upper surface of the channel 1120. As a result, the pressure-sensing transistor 112 is closed and allows larger currents of more than 10 microamperes (may not limited to) to flow through the channel 1120.

In one embodiment, the piezoelectric material 1124 comprises a polymer piezoelectric material. In one embodiment, the piezoelectric material 1124 comprises polyvinylidene fluoride or polyvinylidene difluoride (PVDF). In one embodiment, the piezoelectric material 1124 only has PVDF. In one embodiment, the piezoelectric material 1124 comprises a mixture which comprises PVDF and any one of the following materials: lead zirconate titanate (PZT), zinc oxide (ZnO), barium titanate ($BaTiO_3$), lithium niobate ($LiNbO_3$), and lead titanate ($PbTiO_3$).

Referring back to FIG. 1, the second terminal 1122 of the pressure-sensing transistor 112 of each sensing unit 11 may connect to an amplifier circuit 14, which is configured to amplify a current signal read out from the corresponding pressure-sensing transistor 112.

Figure 4:
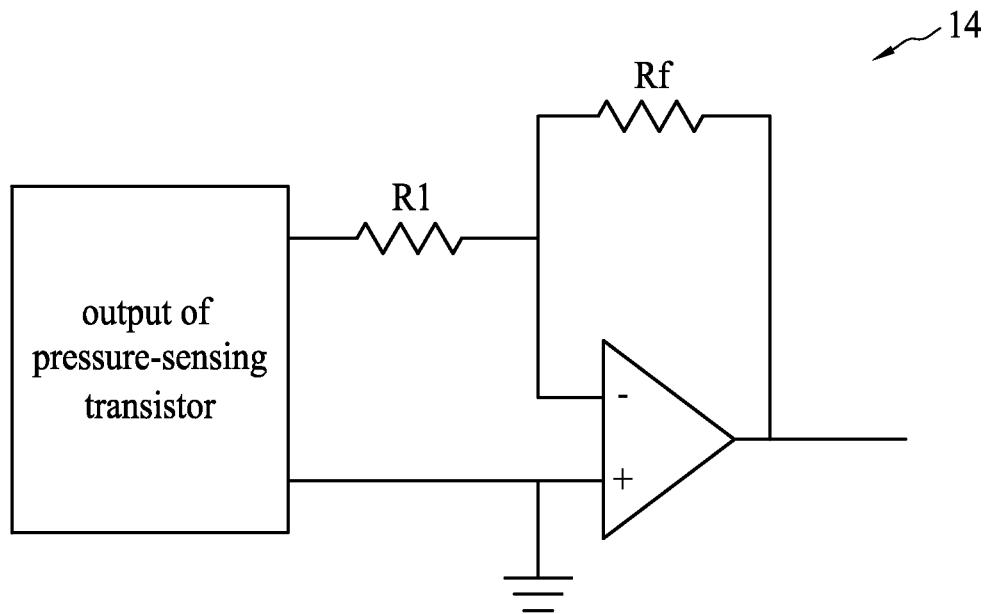
FIG. 4 schematically shows an amplifier circuit according to one embodiment of the present invention.
Figure 5:
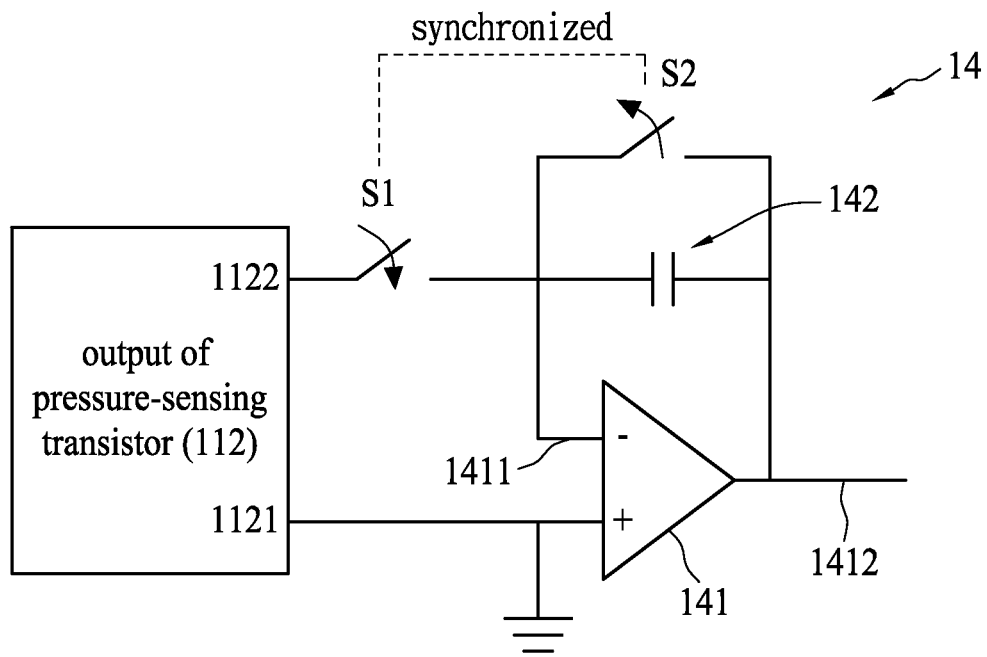
FIG. 5 schematically shows an amplifier circuit according to another embodiment of the present invention.

In one embodiment, referring to FIG. 4, the amplifier circuit 14 may comprise an inverting amplifier connected with resistors Rf and R1, wherein the ratio Rf/R1 is adjustable so as to amplify the output voltage of the pressure-sensing transistor 112. In another embodiment, as shown in FIG. 5, the amplifier circuit 14 comprises a charge amplifier. The amplifier circuit 14 comprises an operation amplifier 141, a first switch S1, a second switch S2, and a capacitor 142. The capacitor 142 connects to an input terminal 1411 and an output terminal 1412 of the operation amplifier 141. The first switch S1 connects to the input terminal 1411 of the operation amplifier 141 and the second terminal 1122 (or an output terminal) of the corresponding pressure-sensing transistor 112. The second switch S2 and the capacitor 142 are connected in parallel. In one embodiment, during open and closed operations, the first switch S1 is out of phase with the second switch S2. In other words, when the second switch S2 is closed, the first switch S1 is open, and at the moment, the corresponding capacitor 142 discharges; alternatively, when the first switch S1 is closed and the second switch S2 is open, charges in the pressure-sensing transistor 112 will flow to the capacitor 142; thus, the charge output of the pressure-sensing transistor 112 can be converted into a voltage, and a touch position, a single touch region, or multi-touch regions (or positions) can be detected on the panel.

In particular, as shown in FIG. 3, when the panel is touched, the piezoelectric material 1124 of the pressure-sensing transistor 112 is pressed, electricity can flow through the channel 1120 of the pressure-sensing transistor 112, and at that moment, if the corresponding selection transistor 111 is activated, a current can flow from the corresponding sensing electrode 13, through the corresponding pressure-sensing transistor 112, and to the amplifier circuit 14. Alternatively, if the piezoelectric material 1124 of the pressure-sensing transistor 112 is untouched, a current cannot flow through the corresponding pressure-sensing transistor 112. By examining current from a pressure-sensing transistor 112, it can be determined whether the pressure-sensing transistor is touched or not, and a touch position, a single touch region, or multi-touch regions (or positions) can be determined accordingly.

Referring to FIG. 3, the channel 1120 is a semiconductor layer. In one embodiment, the first terminal 1121 partially contacts an upper surface of the semiconductor layer 1120. The second terminal 1122 partially contacts the upper surface of the semiconductor layer 1120. In one embodiment, the first terminal 1121 and the second terminal 1122 of the pressure-sensing transistor 112, the piezoelectric material 1124, and the channel 1120 are partially overlapped in a vertical direction, and such design can significantly lower the resistance of the depletion layer adjacent to the second terminal, decrease power consumption, and increase response speed when the pressure-sensing transistor 112 is activated.

In one embodiment, the semiconductor layer 1120 comprises amorphous silicon, polysilicon, or monocrystalline silicon. The semiconductor layer 1120 may be doped with p-type impurities or trivalent elements to form a p-type semiconductor layer. Alternatively, the semiconductor layer 1120 may be doped with n-type impurities or pentavalent elements to form an n-type semiconductor layer.

The piezoelectric material 1124 is separated from the first and second terminals 1121 and 1122 of the pressure-sensing transistor 112 and the semiconductor layer 1120 by an insulation layer 1125. The insulation layer 1125 can be made of an insulation layer having a high dielectric constant so that the sensitivity of the panel can be improved. In one embodiment, the insulation layer 1125 may comprise aluminum oxide. In one embodiment, the insulation layer 1125 comprises titanium dioxide. In one embodiment, the insulation layer 1125 comprises zirconium dioxide.

Referring to FIG. 3, the piezoelectric material 1124 may be covered by another insulation layer 1126. The insulation layer 1126 can be made of an insulation layer having a high dielectric constant so that the sensitivity of the panel can be improved. In one embodiment, the insulation layer 1126 comprises titanium dioxide. In one embodiment, the insulation layer 1126 comprises zirconium dioxide.

Referring to FIG. 3, the touch panel 1 comprises a circuit 23, which includes a portion connecting with electronic components of the touch panel 1. The circuit 23 may comprise a conductor layer 1127, which may be formed on the insulation layer 1126.

In one embodiment, when the pressure-sensing transistor 112 comprises a n-type metal oxide semiconductor transistor, the first terminal 1121 and the second terminal 1122 of the pressure-sensing transistor 112 may comprise a semiconductor material, such as silicon, and an n-type pentavalent material, such as phosphorous. In one embodiment, when the pressure-sensing transistor 112 comprises an n-type metal oxide semiconductor transistor, the first terminal 1121 and the second terminal 1122 of the pressure-sensing transistor 112 may comprise an n-type semiconductor, such as n-type amorphous silicon, n-type polysilicon, or n-type single crystalline silicon. In particular, when the pressure-sensing transistor 112 comprises an n-type metal oxide semiconductor transistor, the first terminal 1121 and the second terminal 1122 of the pressure-sensing transistor 112 are formed by using an electron beam (gun) to vapor-deposit powder formed from a mixture of silicon and pentavalent material such as phosphorous.

In one embodiment, when the pressure-sensing transistor 112 comprises a p-type metal oxide semiconductor transistor, the first terminal 1121 and the second terminal 1122 of the pressure-sensing transistor 112 comprises a semiconductor, such as silicon, and a trivalent material, such as boron. When the pressure-sensing transistor 112 comprises a p-type metal oxide semiconductor transistor, the first terminal 1121 and the second terminal 1122 of the pressure-sensing transistor 112 comprise p-type semiconductors, such as p-type amorphous silicon, p-type polysilicon, or p-type single crystalline silicon. In particular, when the pressure-sensing transistor 112 comprises a p-type metal oxide semiconductor transistor, the first terminal 1121 and the second terminal 1122 of the pressure-sensing transistor 112 are formed by using an electron beam (gun) to vapor-deposit powder formed from a mixture of silicon and trivalent material, such as boron.

Referring again to FIG. 3, the selection transistor 111 may comprise a semiconductor layer 1114, which may comprise a channel. In one embodiment, the semiconductor layer 1114 comprises amorphous silicon, polysilicon, or single crystalline silicon. The semiconductor layer 1114 may be doped with p-type impurities to form a p-type semiconductor layer; or may be doped with n-type impurities to form an n-type semiconductor layer.

Referring to FIG. 3, the substrate 10 may comprise a glass substrate or a flexible substrate. The substrate 10 has two major surfaces, which may be covered by silicon dioxide layers 16 and/or positive photoresist layers 17 for insulating heat and blocking moisture penetration. In one embodiment, the sensing units 11 are directly formed on the silicon dioxide layer. In one embodiment, the sensing units 11 are directly formed on the photoresist layer 17.

Figure 6:
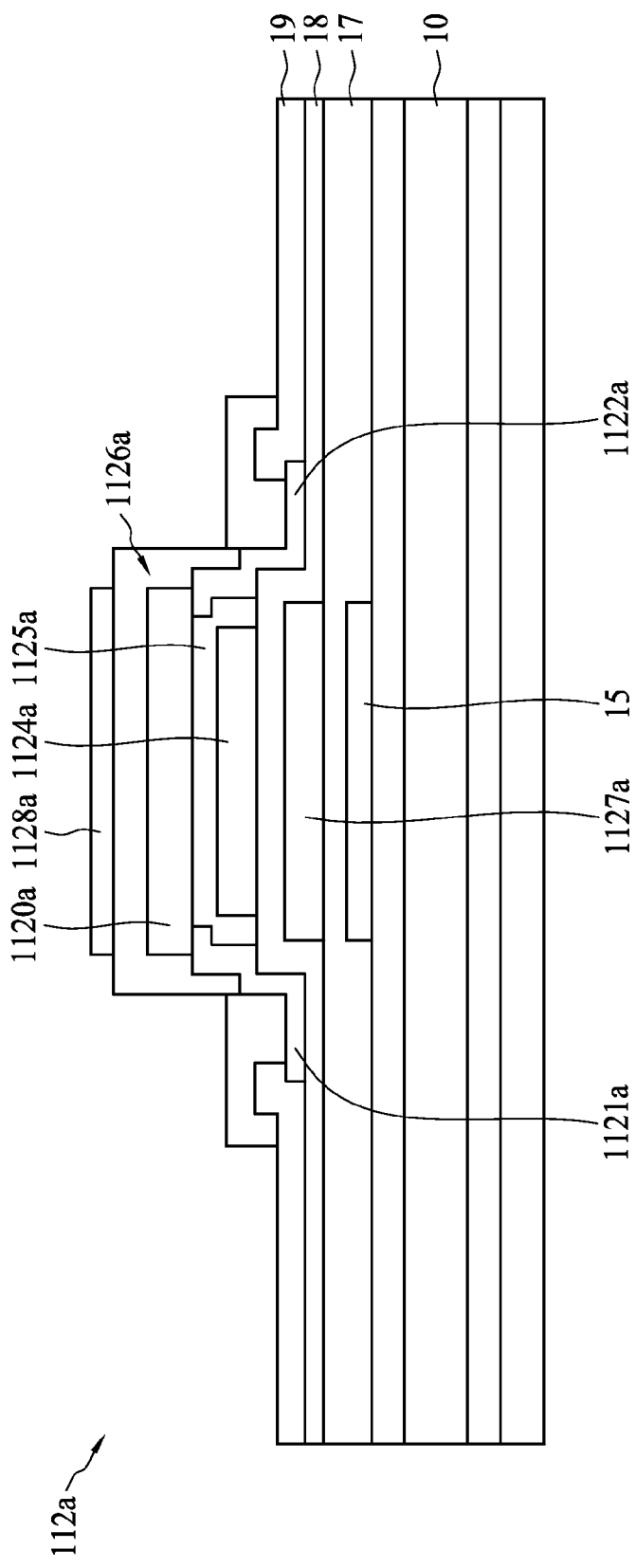
FIG. 6 is a cross-sectional view showing a pressure-sensing transistor according to another embodiment of the present invention.

FIG. 6 is a cross-sectional view showing a pressure-sensing transistor 112a according to another embodiment of the present invention. Referring to FIG. 6, for each pressure-sensing transistor 112a, a black matrix material 15 is formed on the substrate 10. A positive photoresist layer 17 covers the black matrix material 15. A conductor layer 1127aof, for example aluminum or indium tin oxide, is formed on the positive photoresist layer 17 and corresponds to the black matrix material 15. An insulation layer 18 covers the conductor layer 1127a. A piezoelectric material 1124a is formed correspondingly to the conductor layer 1127a and on the insulation layer 18. An insulation layer 1125a covers the piezoelectric material 1124a. A semiconductor layer 1120a is formed correspondingly to the piezoelectric material 1124a and on the insulation layer 1125a. Portions of the first terminal 1121a and the second terminal 1122a are formed underneath the semiconductor layer 1120a and directly connect to the semiconductor layer 1120a. An insulation material 1126a is formed on the semiconductor layer 1120a to block moisture penetration. A conductor layer 1128a, which is used together with another conductor layer 1127a and functions as a terminal for performing a poling process to the piezoelectric material 1124a, is formed on the insulation material 1126a. The conductor layer 1128a can be made of aluminum or indium tin oxide.

In one embodiment, the insulation layers 18, 1125a, and 1126a can be made of aluminum oxide. Aluminum oxide can lower the polarized voltage required for poling the piezoelectric material 1124a. Similarly, in one embodiment, the insulation layers 18, 1125a, and 1126a may be made of titanium dioxide. Similarly, in one embodiment, the insulation layers 18, 1125a, and 1126a may be made of zirconium dioxide.

Figure 7:
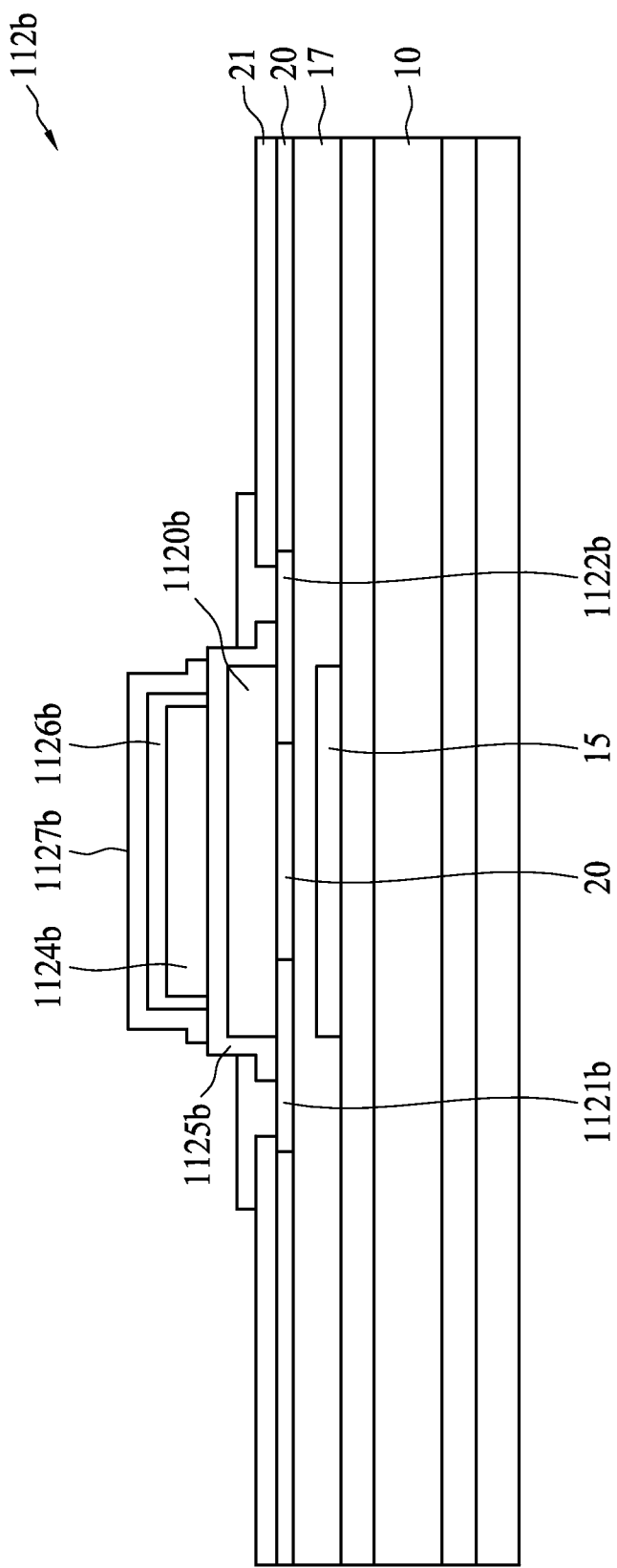
FIG. 7 is a cross-sectional view showing a pressure-sensing transistor according to another embodiment of the present invention.

FIG. 7 is a cross-sectional view showing a pressure-sensing transistor 112b according to another embodiment of the present invention. Referring to FIG. 7, for each pressure-sensing transistor 112b, a black matrix material 15 is formed on the substrate 10. A positive photoresist layer 17 covers the black matrix material 15. The first terminal 1121b and the second terminal 1122b are formed on the photoresist layer 17. An insulation layer 20 is formed between the first terminal 1121b and the second terminal 1122b. A semiconductor layer 1120b is formed on the insulation layer 20 and portions of the first terminal 1121b and the second terminal 1122b, wherein the semiconductor layer 1120b directly contacts the portions of the first terminal 1121b and the second terminal 1122b. An insulation layer 21 covers the insulation layer 20 and portions of the first terminal 1121b and the second terminal 1122b. An insulation layer 1125b covers the semiconductor layer 1120b. A piezoelectric material 1124b is formed correspondingly to the semiconductor layer 1120b and on the insulation layer 1125b. An insulation layer 1126b covers the piezoelectric material 1124b. A conductor layer 1127b made of, for example aluminum or indium tin oxide, covers the insulation layer 1126b on the piezoelectric material 1124b. The conductor layer 1127b can be used together with the black matrix material 15 for performing a poling process to the piezoelectric material 1124b.

In one embodiment, the insulation layers 20, 1125b, and 1126b may be made of aluminum oxide to lower the voltage required for poling the piezoelectric material 1124b. Similarly, in one embodiment, the insulation layers 20, 1125b, and 1126b may be made of titanium dioxide. Similarly, in one embodiment, the insulation layers 20, 1125b, and 1126b may be made of zirconium dioxide.

Figure 8:
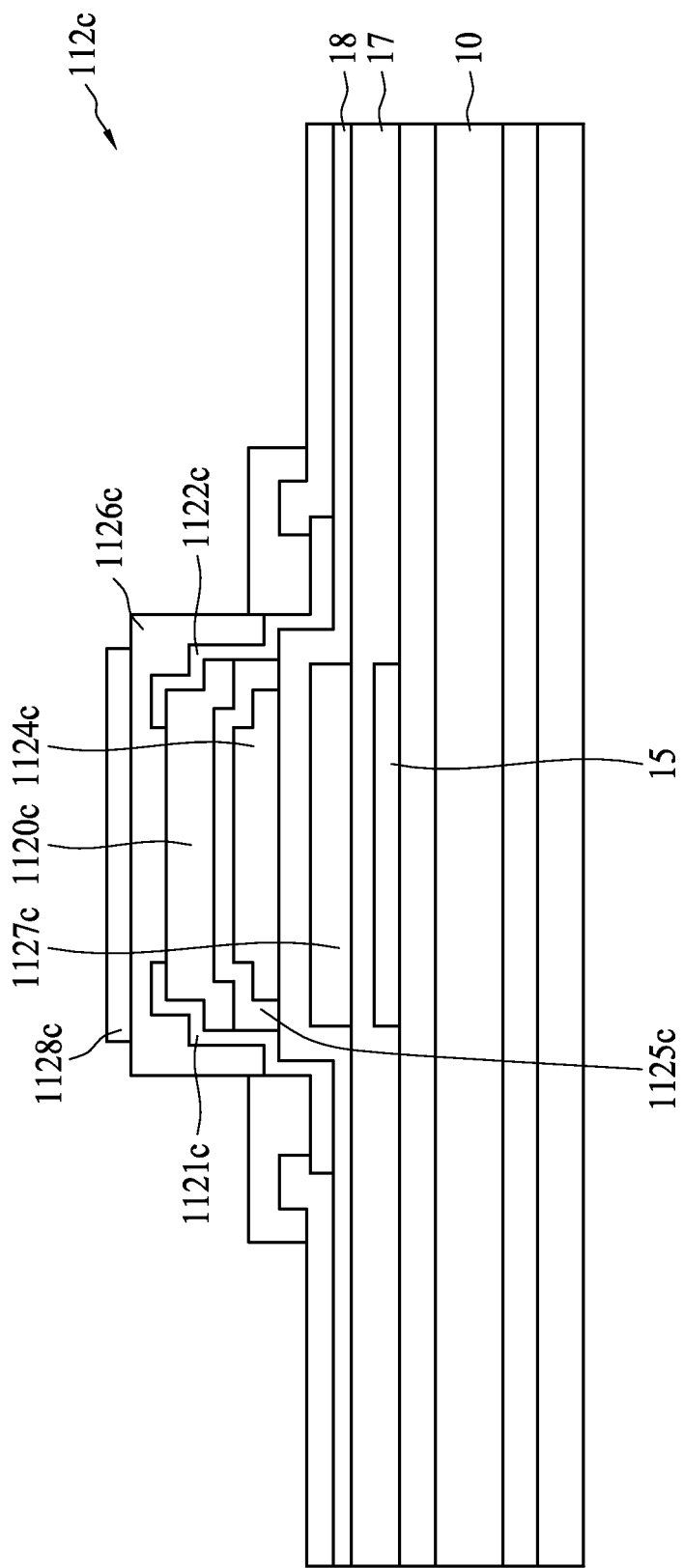
FIG. 8 is a cross-sectional view showing a pressure-sensing transistor according to another embodiment of the present invention.

FIG. 8 is a cross-sectional view showing a pressure-sensing transistor 112c according to another embodiment of the present invention. Referring to FIG. 8, the pressure-sensing transistor 112c is similar to the pressure-sensing transistor 112a of FIG. 6, one major difference is that the first terminal 1121a and the second terminal 1122c of the pressure-sensing transistor 112c extend from an insulation layer 18 to an upper surface of the semiconductor layer 1120c and directly contact the upper surface. Above the semiconductor layer 1120c is an insulation material 1126c, and below the semiconductor layer 1120c is an insulation material 1125c. The insulation materials 1125c and 1126c can block moisture penetration.

Moreover, a conductor layer 1128c made of, for example aluminum or indium tin oxide, is formed on the insulation material 1126c. The conductor layer 1128c can be used together with another conductor layer 1127c for performing a poling process to the piezoelectric material 1124c.

In addition, one embodiment of the present disclosure provides a method of forming a touch panel. The steps of the method are explained by using the embodiment of FIG. 3; however, the method is not limited to the embodiment of FIG. 3. The method can be applied on the embodiments of FIGS. 6 to 8 and alternative embodiments without departing from the scope of the following claims. Referring to FIG. 3, the method forms a black matrix material 15 on a substrate 10. Next, semiconductor layers 1114 and 1120 are formed on the substrate 10, wherein the semiconductor layers 1114 and 1120 are on the black matrix material 15. Thereafter, a first terminal 1111, a second terminal 1112, a first terminal 1121 and a second terminal 1122 are formed on the substrate 10, wherein the first terminal 1111 and the second terminal 1112 have portions contacting the semiconductor layer 1114; and the first terminal 1121 and the second terminal 1122 contact the semiconductor layer 1120. Subsequently, insulation layers 1115 and 1125 are formed on the substrate 10, wherein the insulation layers 1115 and 1125 respectively cover the semiconductor layers 1114 and 1120. Further, a piezoelectric material 1124 is formed on the substrate 100, wherein the piezoelectric material 1124 is formed on the insulation layer 1125 and corresponds to the black matrix material 15. Moreover, a circuit 23 including a conductor layer 1127 is formed on the substrate 10. In addition, a voltage is applied between the conductor layer 1127 and the black matrix material 15 (or the conductor layer 1128a of FIG. 6 or the conductor layer 1128c of FIG. 8) so as to perform a poling process to the piezoelectric material 1124.

In some embodiments, a touch panel comprises a pressure-sensing transistor having a piezoelectric material which has a property of piezoelectricity and exhibits electrical potential when it is pressed, and the electrical potential can activate the pressure-sensing transistor to allow a current to flow through the pressure-sensing transistor. The location of a touch can be determined by examining which pressure-sensing transistor allows a current to flow. In some embodiments, a touch panel comprises a plurality of sensing-units, and each sensing unit comprises a selection transistor and a pressure-sensing transistor. The sensing-units can be used to determine a touch position, a single touch region, or multi-touch regions (or positions).

The above-described embodiments of the present invention are intended to be illustrative only. Those skilled in the art may devise numerous alternative embodiments without departing from the scope of the following claims.

What is claimed is:

1. A touch panel comprising:
a substrate;
a plurality of transparent drive electrodes arranged in a matrix and formed on the substrate;
a plurality of transparent sensing electrodes arranged in a matrix and formed on the substrate; and
a plurality of basic sensing-units arranged in a matrix and formed on the substrate, each basic sensing-unit comprising:
a pressure-sensing transistor comprising a first terminal, a second terminal, a channel connecting the first and second terminals, a dielectric layer formed on the channel, a piezoelectric material formed on the dielectric layer, wherein the piezoelectric material comprises PVDF (polyvinylidene fluoride or polyvinylidene difluoride), or a mixture of PVDF and any one of lead zirconate titanate, zinc oxide, barium titanate, lithium niobate, or lead titanate; and a selection transistor formed on the substrate, the selection transistor comprising a first terminal, a second terminal, and a third terminal, wherein the first terminal of the selection transistor connects to a corresponding one of the sensing electrodes, the second terminal of the selection transistor connects to the first terminal of the pressure-sensing transistor, and the third terminal of the selection transistor is a transistor gate and connects to a corresponding one of the drive electrodes.

2. The touch panel of claim 1, wherein each pressure-sensing transistor comprises a semiconductor layer including the channel, wherein each of the first and second terminals of each pressure-sensing transistor partially contacts an upper or lower surface of the corresponding semiconductor layer.

3. The touch panel method of claim 2, wherein the piezoelectric material is on the semiconductor layer.

4. The touch panel of claim 2, wherein the piezoelectric material is below the semiconductor layer.

5. The touch panel of claim 2, wherein a portion of the first terminal and a portion of the second terminal of each pressure-sensing transistor overlap the piezoelectric material and the channel of the pressure-sensing transistor.

6. The touch panel of claim 1, further comprising a plurality of amplifier circuits, wherein each amplifier circuit connects to the second terminal of a corresponding one of the pressure-sensing transistors.

7. The touch panel of claim 6, wherein the amplifier circuit is a charge amplifier.

8. The touch panel of claim 6, wherein each amplifier circuit comprises an operational amplifier, a first switch, a second switch, and a capacitor, wherein the capacitor connects to an input and an output of the operation amplifier; the first switch connects to the input terminal of the operational amplifier and the second terminal of the corresponding pressure-sensing transistor; and the second switch and the capacitor are connected in parallel; wherein the first switch is out of phase with the second switch.

9. The touch panel of claim 1, further comprising a plurality of black matrix materials, wherein each black matrix material is disposed below the corresponding pressure-sensing transistor and the corresponding selection transistor, wherein each black matrix material comprises chrome and is grounded.

10. The touch panel of claim 1, wherein when each pressure-sensing transistor comprises an NMOS transistor, the first and second terminals of each pressure-sensing transistor comprise n-type amorphous silicon, polysilicon, or single crystalline silicon; or, when each pressure-sensing transistor comprises a PMOS transistor, the first and second terminals of each pressure-sensing transistor comprise p-type amorphous silicon, polysilicon, or single crystalline silicon.

11. The touch panel of claim 1, configured to detect a touch position or a single touch region, or multi-touch positions or regions.

* * * * *